(12) United States Patent
Shin et al.

(10) Patent No.: US 9,548,091 B2
(45) Date of Patent: Jan. 17, 2017

(54) MEMORY MODULE HAVING ADDRESS MIRRORING FUNCTION

(71) Applicant: SAMSUNG ELECTRONICS CO., LTD., Suwon-Si, Gyeonggi-Do (KR)

(72) Inventors: Jun-Hee Shin, Seongnam-Si (KR); Sang-Jhun Hwang, Hwaseong-Si (KR); Young-Man Ahn, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/681,402

(22) Filed: Apr. 8, 2015

(65) Prior Publication Data

US 2015/0340074 A1    Nov. 26, 2015

(30) Foreign Application Priority Data

May 23, 2014 (KR) .................... 10-2014-0062607

(51) Int. Cl.
*G11C 8/10* (2006.01)
*G11C 5/04* (2006.01)
*G11C 29/08* (2006.01)
*G11C 29/26* (2006.01)
*G11C 11/401* (2006.01)

(52) U.S. Cl.
CPC . *G11C 8/10* (2013.01); *G11C 5/04* (2013.01); *G11C 29/08* (2013.01); *G11C 29/26* (2013.01); *G11C 11/401* (2013.01)

(58) Field of Classification Search
None
See application file for complete search history.

(56) References Cited

U.S. PATENT DOCUMENTS

| | | |
|---|---|---|
| 7,042,794 B2 | 5/2006 | Kim |
| 7,580,318 B2 | 8/2009 | Kim et al. |
| 7,761,753 B2 | 7/2010 | Vogt et al. |
| 8,094,504 B2 | 1/2012 | Smolka |
| 8,151,132 B2 | 4/2012 | Smolka |
| 8,171,331 B2 | 5/2012 | Vogt |
| 8,233,304 B2 | 7/2012 | Xu |
| 8,239,658 B2 | 8/2012 | Rezeanu |
| 8,275,936 B1 | 9/2012 | Haywood et al. |
| 8,619,452 B2 | 12/2013 | Rajan et al. |
| 2008/0046631 A1* | 2/2008 | Takaku ............... G06F 13/1668 711/2 |

(Continued)

OTHER PUBLICATIONS

Rhoden, Desi, "The Evolution of DDRJNPHI," VIA Technology Forum 2005.*

(Continued)

*Primary Examiner* — James G Norman
(74) *Attorney, Agent, or Firm* — Volentine & Whitt, PLLC

(57) ABSTRACT

A memory module having an address mirroring function is provided. The memory module includes a register that allows mode registers of first memory chips of a first rank and mode registers of second memory chips of a second rank to be identically programmed in response to a mode register set (MRS) command during a rank-merged test mode. The register sets address signals, which are symmetrically connected to the first and second memory chips through through-via-holes (TVHs) or blind-via-holes (BVHs) of a printed circuit board, to be selectively mirrored.

19 Claims, 11 Drawing Sheets

(56) References Cited

U.S. PATENT DOCUMENTS

2011/0176371 A1* 7/2011 Jang .................... G11C 5/04
365/189.05

OTHER PUBLICATIONS

Rhoden, Desi, "The Evolution of DDR-JNPHI," VIA Technology Forum 2005 (hereinafter 'Rhoden').*
"DDR4 RDIMM," Micron Technology, Inc., 2013.
Rhoden, Desi, "The Evolution of DDR_INPHI," VIA Technology Forum 2005.
Mohammed, Ilyas, "Thermal Management Challenges in Mobile Integrated Systems," Invensas, Mar. 18, 2013.
DocMemory, "Understanding DDR4 Serial Presence Detect (SPD) Table," Simmtester.com, Jan. 14, 2014.

* cited by examiner

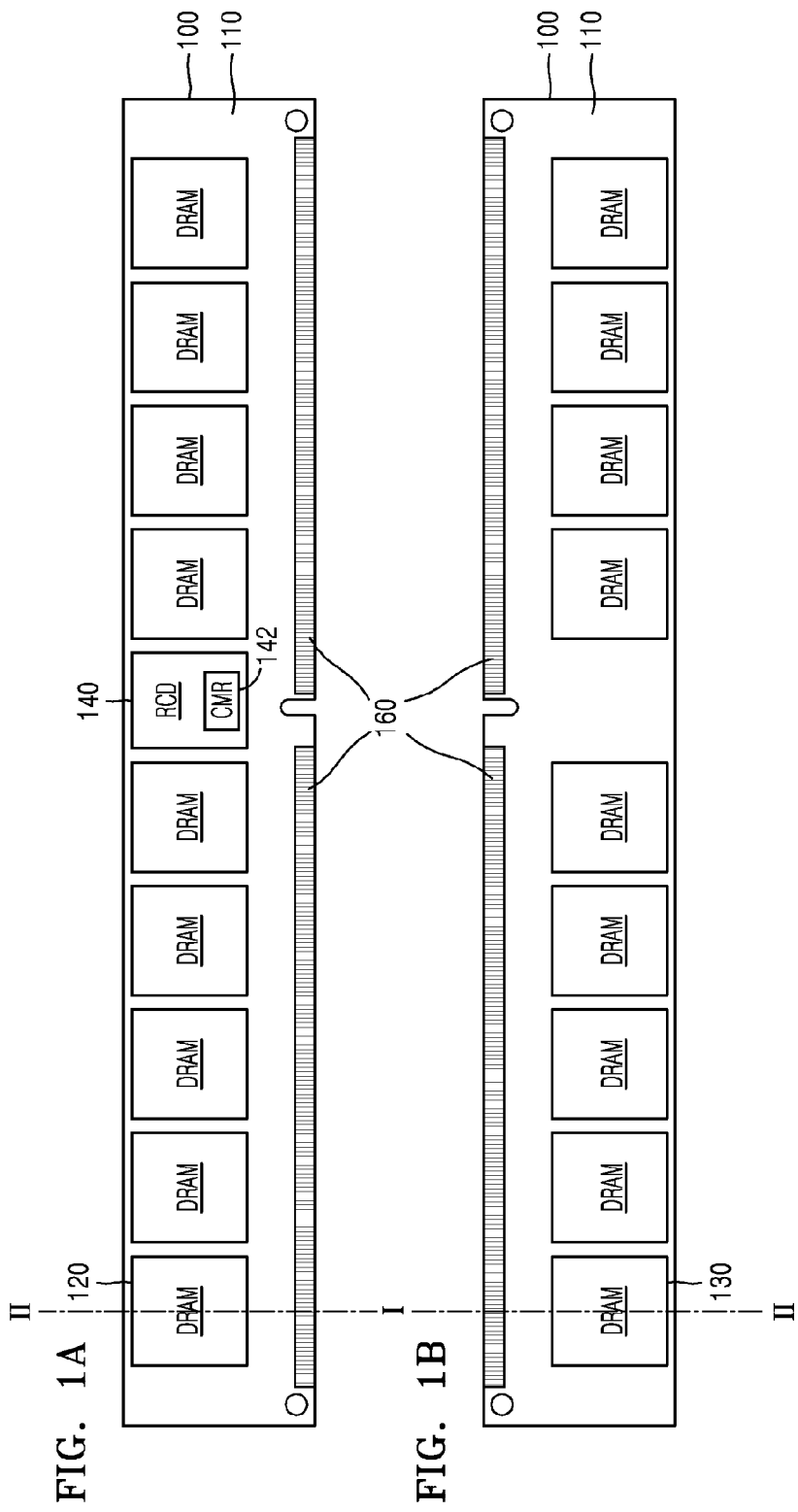

FIG. 2A

| | 1 | 2 | 3 |
|---|---|---|---|
| A | VDD | | |
| B | VPP | VSSQ | TDQS_c³ |
| C | VDDQ | VDDQ | DQS_c |
| D | VSSQ | DQ0 | DQS_t |
| E | VSS | DQ4 / NC² | DQ2 |
| F | VDD | VDDQ | DQ6 / NC¹ |
| G | VSS | C2 / ODT1 | ODT |
| H | VDD | C0 / CKE1 | CKE |
| J | VREFCA | WE_n / A14 | ACT_n |
| K | VSS | BG0 | A10 / AP |
| L | RESET_n | BA0 | A4 |
| M | VDD | A6 | A0 |
| N | VSS | A8 | A2 |
| | | A11 | PAR |

| | 7 | 8 | 9 |
|---|---|---|---|
| A | DM_n / DBL_n / TDQS_t² | VSSQ | VSS |
| B | DQ1 | VDDQ | ZQ |
| C | VDD | VSS | VDDQ |
| D | DQ3 | DQ5 / NC² | VSSQ |
| E | DQ7 / NC¹ | VDDQ | VSS |
| F | CK_t | CK_c | VDD |
| G | CS_n | C1 / CS1_n | RFU |
| H | CAS_n / A15 | RAS_n / A16 | VSS |
| J | A12 / BC_n | BG1 | VDD |
| K | A3 | BA1 | VSS |
| L | A1 | A5 | ALERT_n |
| M | A9 | A7 | VPP |
| N | A17 / NC⁴ | A13 | VDD |

O Populated ball
+ Ball not populated

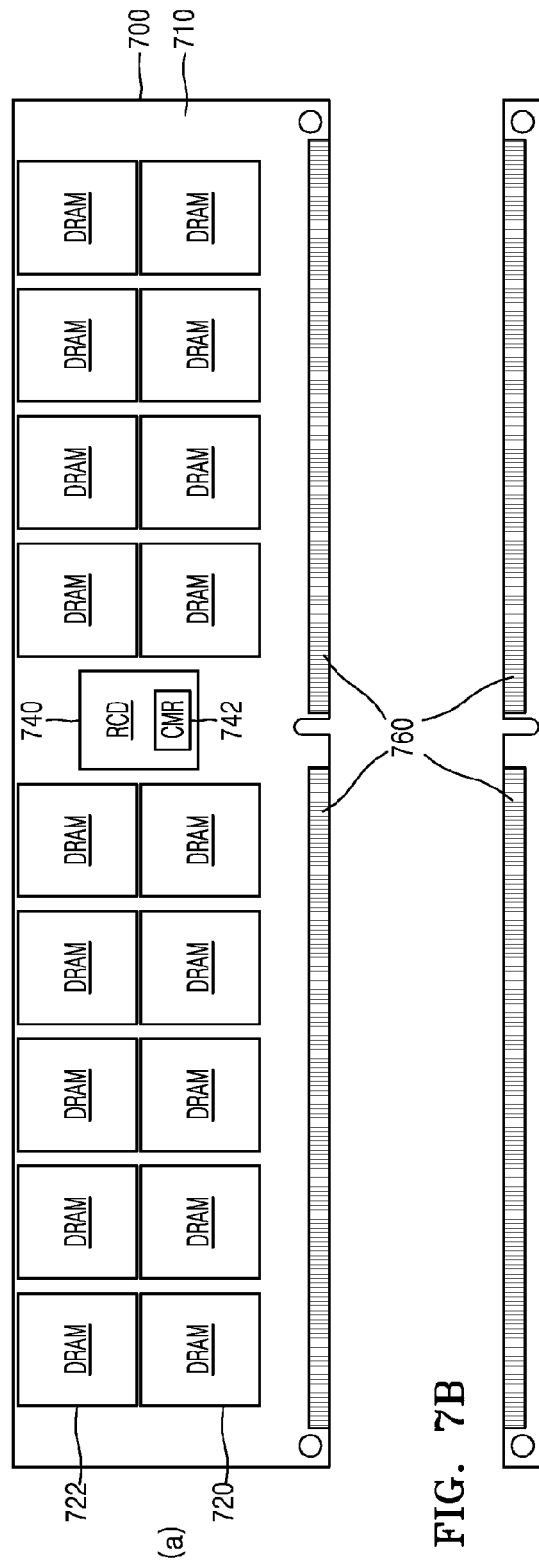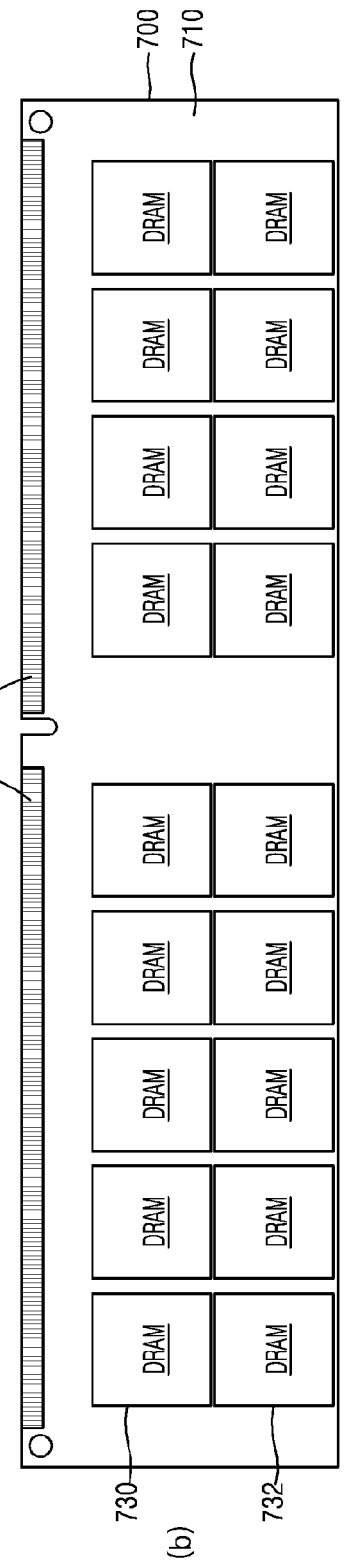

MEMORY MODULE HAVING ADDRESS MIRRORING FUNCTION

CROSS-REFERENCE TO RELATED APPLICATIONS

A claim for priority under 35 U.S.C. §119 is made to Korean Patent Application No. 10-2014-0062607, filed on May 23, 2014, in the Korean Intellectual Property Office, the entire contents of which are hereby incorporated by reference.

BACKGROUND

The inventive concepts described herein relate to memory modules, and more particularly, to memory modules that perform an address mirroring function to reduce test time.

In a data processing systems such as personal computers (PCs), server computers, workstations, or communication systems, module-type memories may be used as data storage memory. In view of the demand for high capacity, high density, and high performance, there has been a trend toward providing data processing systems with high capacity memory modules. However, an extended amount of time is required to test high capacity memory modules, thereby lowering productivity. Accordingly, there is a desire to provide memory module that may reduce required test time.

SUMMARY

Embodiments of the inventive concept provide a memory module having an address mirroring function to reduce test time.

According to embodiments of the inventive concept, there is provided a memory module including first memory chips of a first rank, mounted on a first surface of a printed circuit board; and second memory chips of a second rank, mounted on a second surface of the printed circuit board that is opposite to the first surface of the printed circuit board. The memory module further includes a register configured to identically program mode registers of the first memory chips of the first rank and mode registers of the second memory chips of the second rank according to address signals received together with a first mode register set (MRS) command, in response to the first MRS command during testing of the memory module.

In embodiments of the inventive concept, the memory module may be a mirrored module wherein balls of the first memory chips are connected to balls of the second memory chips through through-via-holes (TVHs) or blind-via-holes (BVHs) of the printed circuit board.

In embodiments of the inventive concept, the first and second balls of a first memory chip to which first and second address signals are respectively applied, may be respectively mirrored and connected to second and first balls of a second memory chip to which the second and first address signals are respectively applied, through the TVHs or BVHs of the printed circuit board, and the first and second address signals may be set so as to be selectively mirrored by the register.

In embodiments of the inventive concept, the first and second address signals may be address signals other than address signals set by a command from among the received address signals.

In embodiments of the inventive concept, the register may be configured to receive the first MRS command for the first memory chips of the first rank and the address signals, and program the mode registers of the first memory chips of the first rank according to the address signals.

In embodiments of the inventive concept, the register may be configured to generate a second MRS command for the second memory chips of the second rank, select address signals set to be address-mirrored from among the address signals, convert the selected address signals into mirrored address signals in response to the second MRS command, and program the mode registers of the second memory chips of the second rank according to the address signals including the mirrored address signals.

In embodiments of the inventive concept, the register may include a command decoder configured to generate an internal chip selection signal in response to the first MRS command; a control logic configured to detect the internal chip selection signal and generate a mirror mode flag signal in response to the detected internal chip selection signal; and an address register configured to receive the address signals, select address signals set to be address-mirrored from among the received address signals, and convert the selected address signals into mirroring address signals in response to the mirror mode flag signal.

In embodiments of the inventive concept, the command decoder may be configured to generate the internal chip selection signal according to a first chip selection signal included in the first MRS command for the first memory chips of the first rank, generate a second MRS command to set the mode registers of the second memory chips of the second rank, and generate the internal chip selection signal according to a second chip selection signal included in the second MRS command.

In embodiments of the inventive concept, the control logic may include a detector configured to detect the internal chip selection signal; and a mirror mode flag generator configured to deactivate the mirror mode flag signal when the internal chip selection signal is the same as the first chip selection signal and activate the mirror mode flag signal when the internal chip selection signal is the same as the second chip selection signal.

In embodiments of the inventive concept, the memory module may further include third memory chips of a third rank, mounted on the first surface of the printed circuit board; and fourth memory chips of a fourth rank, mounted on the second surface of the printed circuit board. The may be configured to identically program mode registers of the third memory chips of the third rank and mode registers of the fourth memory chips of the fourth rank according to second address signals received together with a third MRS command.

In embodiments of the inventive concept, the memory module may be a mirrored module wherein balls of the third memory chips are connected to balls of the fourth memory chips through through-via-holes (TVHs) or blind-via-holes (BVHs) of the printed circuit board.

In embodiments of the inventive concept, the first and second balls of a third memory chip to which third and fourth address signals are respectively applied, may be respectively mirrored and connected to second and first balls of a fourth memory chip to which the fourth and third address signals are respectively applied, through the TVHs or BVHs of the printed circuit board, and the third and fourth address signals may be set so as to be selectively mirrored by the register.

In embodiments of the inventive concept, the third and fourth address signals may be address signals other than address signals set by a command from among the received address signals.

In embodiments of the inventive concept, the register may be configured to receive the third MRS command for the third memory chips of the third rank and address signals, and may program the mode registers of the third memory chips of the third rank according to the address signals.

In embodiments of the inventive concept, the register may be configured to generate a fourth MRS command for the fourth memory chips of the fourth rank, select address signals set to be address-mirrored from among address signals which are received together with the third MRS command, convert the selected address signals into mirrored address signals in response to the fourth MRS command, and program the mode registers of the fourth memory chips of the fourth rank according to the address signals including the mirrored address signals.

According to embodiments of the inventive concept, there is provided a method of testing a memory module in which balls of first memory chips of a first rank on a first surface of a printed circuit board are connected to balls of second memory chips of a second rank on a second surface of the printed circuit board which is opposite to the first surface through through-via-holes (TVHs) or blind-via-holes (BVHs) of the printed circuit board. The method includes receiving a first mode register set (MRS) command for the first memory chips of the first rank and address signals, and programming mode registers of the first memory chips of the first rank according to the address signals; and generating a second MRS command for the second memory chips of the second rank, selecting address signals set to be address-mirrored from among the address signals, converting the selected address signals into mirrored address signals in response to the second MRS command, and programming mode registers of the second memory chips of the second rank according to the address signals including the mirrored address signals.

According to embodiments of the inventive concept, there is provided a memory system including a memory module in which balls of first memory chips of a first rank on a first surface of a printed circuit board are connected to balls of second memory chips of a second rank on a second surface of the printed circuit board which is opposite to the first surface through through-via-holes (TVHs) or blind-via-holes (BVHs) of the printed circuit board; and a memory controller configured to issue a first mode register set (MRS) command for the first memory chips of the first rank and address signals, and identically program mode registers of the first memory chips of the first rank and mode registers of the second memory chips of the second rank according to the address signals, during testing of the memory module.

In embodiments of the inventive concept, the memory controller is configured to generate a second MRS command for the second memory chips of the second rank, select address signals set to be address-mirrored from among the address signals, convert the selected address signals into mirrored address signals, and program the mode registers of the second memory chips of the second rank according to the address signals including the mirrored address signals.

According to embodiments of the inventive concept, there is provided a register for testing a memory module, the register including a control logic configured to receive a first mode register set (MRS) command and address signals for testing first memory chips of a first rank on a first surface of a printed circuit board of the memory module, and generate a mirror mode flag signal responsive to the first MRS command; and an address register configured to provide the address signals for programming mode registers of the first memory chips, and provide mirrored address signals for programming mode registers of second memory chips of a second rank on a second surface of the printed circuit board opposite the first surface, responsive to the mirror mode flag signal.

In embodiments of the inventive concept, the address register may be further configured to detect selected address signals from among the address signals, and convert the selected address signals into the mirrored address signals.

In embodiments of the inventive concept, the control logic may include a command decoder configured to generate an internal chip selection signal according to a first chip selection signal included in the first MRS command, generate a second MRS command to set the mode registers of the second memory chips of the second rank, and generate the internal chip selection signal according to a second chip selection signal included in the second MRS command; a detector configured to detect the internal chip selection signal; and a mirror mode flag generator configured to generate the mirror mode flag signal responsive to the internal chip selection signal.

In embodiments of the inventive concept, the control logic command may be configured to receive a second mode register set (MRS) command and second address signals for testing third memory chips of a third rank on the first surface of the printed circuit board of the memory module, and generate a second mirror mode flag signal responsive to the second MRS command, and the address register may be further configured to provide the second address signals for programming mode registers of the third memory chips, and provide mirrored second address signals for programming mode registers of fourth memory chips of a fourth rank on the second surface of the printed circuit board, responsive to the second mirror mode flag signal.

In embodiments of the inventive concept, the address register may be further configured to detect selected address signals from among the second address signals, and convert the selected second address signals into the mirrored second address signals.

BRIEF DESCRIPTION OF THE DRAWINGS

Embodiments of the inventive concept will be more clearly understood from the following detailed description taken in conjunction with the accompanying drawings.

FIGS. 1A and 1B are diagrams respectively illustrating first and second surfaces of a memory module having an address mirroring function, according to an embodiment of the inventive concept.

FIGS. 2A and 2B are diagrams explanatory of a package ball assignment of memory chips shown in FIGS. 1A and 1B.

FIGS. 7A and 7B are diagrams respectively illustrating first and second surfaces of a memory module having an address mirroring function, according to another embodiment of the inventive concept.

DETAILED DESCRIPTION

Figure 3:
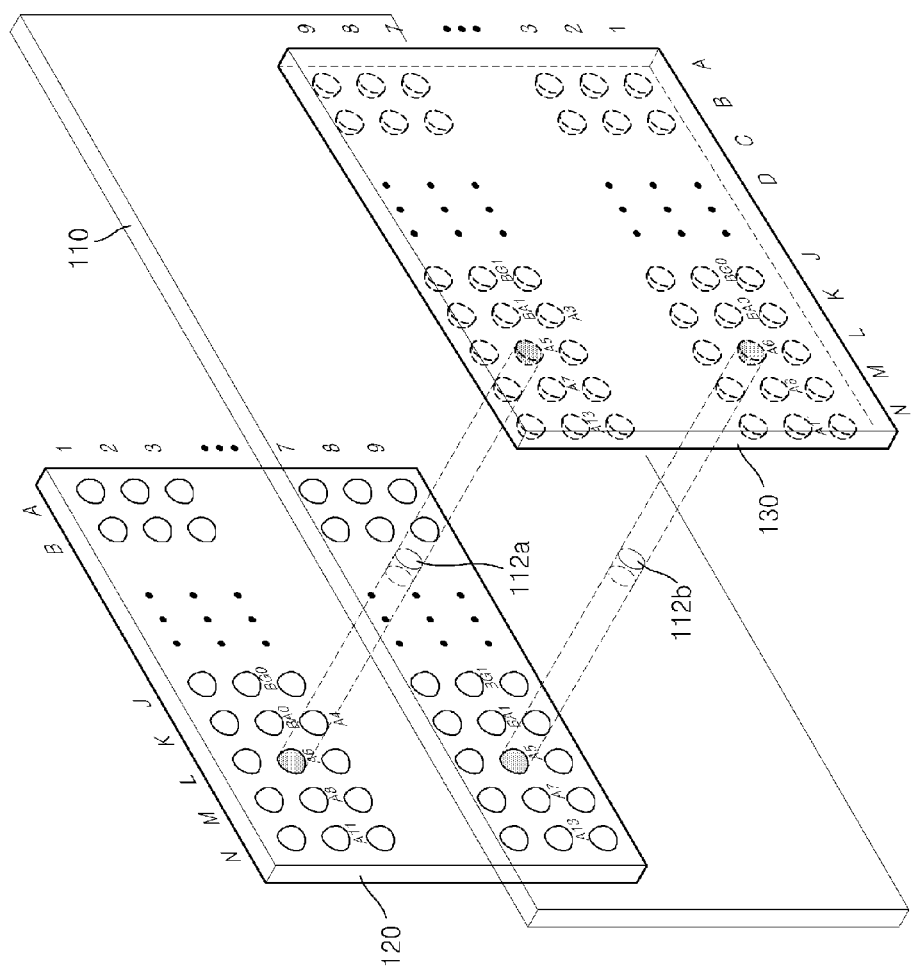
FIG. 3 is a diagram illustrating a portion of the memory module shown in FIGS. 1A and 1B.

In order to fully understand operational advantages of the inventive concept and objects to be attained by embodiments of the inventive concept, the accompanying drawings illustrating example embodiments of the inventive concept and details described in the accompanying drawings should be referred to.

The inventive concept will be described more fully hereinafter with reference to the accompanying drawings, in which elements of the inventive concept are shown. The inventive concept may, however, be embodied in many different forms and should not be construed as limited to the example embodiments set forth herein. Rather, these embodiments are provided so that this disclosure will be thorough and complete, and will fully convey the scope of the inventive concept to one of ordinary skill in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. Like reference numerals refer to like elements throughout. Sizes of structures may be greater or less than real structures for clarity of the inventive concept.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, components, or combinations thereof but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items.

FIGS. 1A and 1B are diagrams respectively illustrating first and second surfaces of a memory module 100 having an address mirroring function, according to an embodiment of the inventive concept.

Referring to FIGS. 1A and 1B, the memory module 100 includes first and second memory chips 120 and 130 and a register 140, mounted on respective surface layers (the uppermost layer shown in FIG. 1A and the lowest layer shown in FIG. 1B) of a printed circuit board 110. The memory module 100 may have a dual in-line memory module (DIMM) form. For example, the memory module 100 may be any one selected from among an unbuffered DIMM (U-DIMM), a registered DIMM (R-DIMM), a fully buffered DIMM (FB-DIMM), and a load reduced DIMM (LR-DIMM).

The number of memory chips (the first and second memory chips 120 and 130) may be determined according to the structure and input/output (I/O) configuration of the memory module 100. For example, in a 1-rank R-DIMM having an I/O×72 configuration, nine memory chips each having an I/O×8 configuration may be mounted on a memory module. Alternatively, in a 2-rank R-DIMM having an I/O×72 configuration, nine memory chips each having an I/O×8 configuration may constitute a first rank and be mounted on a first surface of a memory module, and nine memory chips each having an I/O×8 configuration may constitute a second rank and be mounted on a second surface of the memory module. The second surface of the memory module may be a surface that is opposite to the first surface.

In the embodiment of the inventive concept shown in FIGS. 1A and 1B, eighteen memory chips each having an I/O×8 configuration are mounted on the memory module 100 that is a 2-rank R-DIMM having an I/O×72 configuration. Nine first memory chips 120 are mounted on a first surface of the memory module 100 to constitute a first rank shown in FIG. 1A, and nine second memory chips 130 are mounted on a second surface of the memory module 100 to constitute a second rank shown in FIG. 1B. The first memory chips 120 of the first rank may be activated by a first chip selection signal /CS0, and the second memory chips 130 of the second rank may be activated by a second chip selection signal /CS1.

The first and second memory chips 120 and 130 may include memory devices for storing data. For example, the first and second memory chips 120 and 130 each may include a dynamic random access memory (DRAM) device, and may particularly include a synchronous DRAM device that operates in synchronization with a clock signal. However, the inventive concept is not limited thereto. For example, the first and second memory chips 120 and 130 each may include a resistive RAM (RRAM) device, a phase RAM (PRAM) device, a magnetic RAM (MRAM) device, or a spin transfer torque MRAM (STT-MRAM) device, or the like. Hereinafter, a case where the first and second memory chips 120 and 130 each include an SDRAM device is described as an example.

The first memory chips 120 of the first surface may be respectively connected to the second memory chips 130 of the second surface through through-via-holes (TVHs) or blind-via-holes (BVHs) of the printed circuit board 110. Such a structure may minimize distances between balls of the first memory chips 120 on the first surface and balls of the second memory chips 130 on the second surface, which are connected to the TVHs or BVHs, and thus may reduce stubs. Accordingly, the signal fidelity of signals that are applied to the balls of the first and second memory chips 120 and 130 may be improved.

The register 140 is disposed in a central portion of the first surface of the memory module 100 as shown in FIG. 1A. The register 140 may buffer and re-drive a command, an address, a control signal, and a clock signal that are received through a tab 160. The command, the address, the control signal, and the clock signal that are output from the register 140 may be provided to the first and second memory chips

120 and 130. In some embodiments, the register 140 may be disposed in an area other than the central portion of the first surface of the memory module 100. In some embodiments, the position of the register 140 may be changed to provide a more flexible layout. For example, the register 140 may be disposed on the first surface of the memory module 100 in an area other than the central portion, or may be disposed on the second surface of the memory module 100.

Signals that are output from the register 140 may be provided through common signal lines of the first and second memory chips 120 and 130, may be provided respectively through individual signal lines of the first and second memory chips 120 and 130, or may be provided through signal lines for groups each including several first and second memory chips 120 and 130. Also, the signals that are output from the register 140 may be provided through signal lines electrically connected to the TVHs or BVHs of the printed circuit board 110. When the printed circuit board 110 of the memory module 100 includes multiple layers, signal lines for correspondingly connecting the register 140 to the first and second memory chips 120 and 130 may be formed in an inner layer of the multiple layers.

The register 140 allows mode registers of the first memory chips 120 of the first rank and mode registers of the second memory chips 130 of the second rank to be identically programmed at once in response to a mode register set (MRS) command when testing the memory module 100. That is, the mode registers of the first memory chips 120 of the first rank and the mode registers of the second memory chips 130 of the second rank may be identically programmed by the register 140 according to address signals that are received together with the MRS command.

The register 140 includes a common mode register 142 for setting an operation mode of the memory module 100. The common mode register 142 may set a test mode when testing the memory module 100. For example, the common mode register 142 may set the memory module 100 so that the memory module 100 is tested in a rank-merged test mode and may provide an address mirroring function when testing the memory module 100 in the rank-merged test mode.

The tab 160 is formed on edge portions of the first and second surfaces of the printed circuit board 110. The tab 160 may include a plurality of connecting terminals that are called tab pins. The tab 160 may include command/address/clock/control signal input pins, no-connection pins, and data input/output signal pins. Among tab pins of the tab 160, tab pins for transmitting the command, the address, the clock signal, and the control signal may be electrically connected to the register 140 of the first surface of the printed circuit board 110. Among the tab pins of the tab 160, data tab pins for transmitting data input/output signals DQ may be electrically connected to the first and second memory chips 120 and 130.

The printed circuit board 110 may include various data buses between the data tab pins and data input/output signal DQ pins of the first and second memory chips 120 and 130. In some embodiments, in order to transmit or receive the data input/output signal DQ to or from the first and second memory chips 120 and 130, the printed circuit board 110 may include data tab pins, resistors corresponding to the first and second memory chips 120 and 130, and data buses connected to the first and second memory chips 120 and 130. In some embodiments, the printed circuit board 110 may include data tab pins, data buffers corresponding to the first and second memory chips 120 and 130, and data buses connected to the first and second memory chips 120 and 130. In some embodiments, the printed circuit board 110 may include data tab pins, resistors corresponding to the first and second memory chips 120 and 130, data buffers corresponding to the first and second memory chips 120 and 130, and data buses connected to the first and second memory chips 120 and 130.

The memory module 100 is referred to as a mirrored module in which balls of the first memory chips 120 are symmetrically connected to balls of the second memory chips 130 through the TVHs or BVHs of the printed circuit board 110. In the mirrored module, the first memory chips 120 face the second memory chips 130 with the printed circuit board 110 interposed therebetween. The balls of the first memory chips 120 may be directly or indirectly connected to the balls of the second memory chips 130 through the TVHs or BVHs of the printed circuit board 110.

Figure 2B:
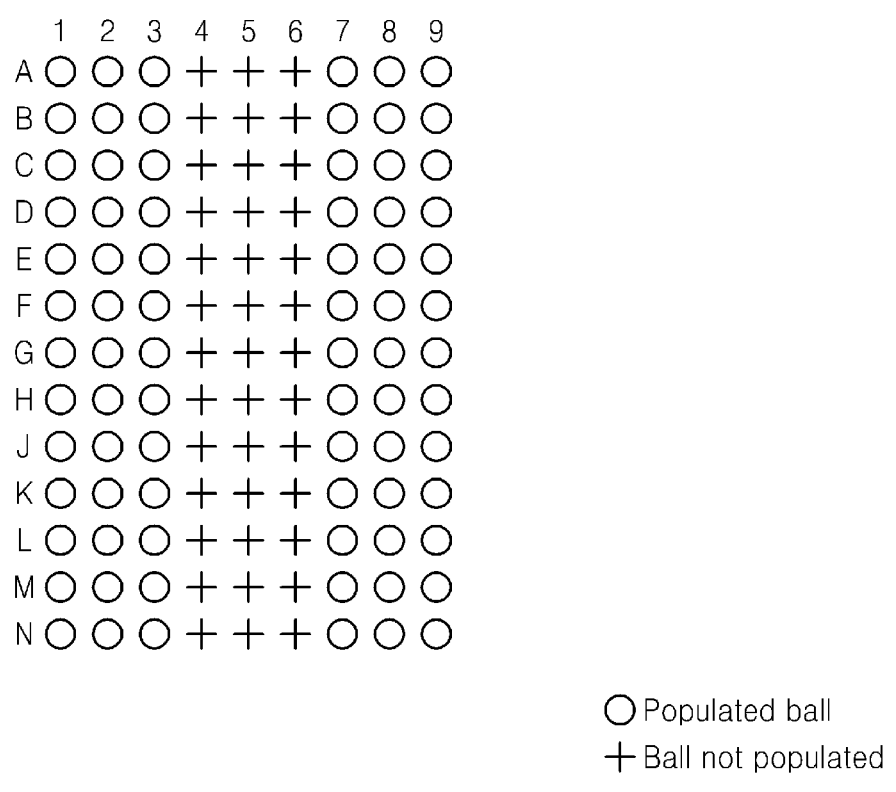

FIGS. 2A and 2B are diagrams explanatory of a package ball assignment of the first and second memory chips 120 and 130 shown in FIGS. 1A and 1B.

Referring to FIGS. 2A and 2B, each of the first and second memory chips 120 and 130 has balls that are arranged in thirteen rows A to N and six columns 1 to 3 and 7 to 9 i.e., two sets of three columns. Non-populated columns 4-6 are disposed between the two sets of columns Balls are electrically populated for a power voltage, a ground voltage, a command, an address, a clock signal, control signals, and data input/output signals.

For example, a ball positioned at the row J and the column 2 may correspond to a bank group address BG0, and a ball positioned at the row J and the column 8 may correspond to a bank group address BG1. The bank group addresses BG0 and BG1 may designate bank groups to which an active command, a read command, a write command, or a pre-charge command is applied.

A ball positioned at the row K and the column 2 may correspond to a bank address BA0, and a ball positioned at the row K and the column 8 may correspond to a bank address BA1. The bank addresses BA0 and BA1 may designate banks to which an active command, a read command, a write command, or a pre-charge command is applied.

A ball positioned at the row K and the column 3 may correspond to an address A4 and a ball positioned at the row K and the column 7 may correspond to an address A3.

A ball positioned at the row L and the column 2 may correspond to an address A6, and a ball positioned at the row L and the column 8 may correspond to an address A5.

A ball positioned at the row M and the column 2 may correspond to an address A8, and a ball positioned at the row M and the column 8 may correspond to an address A7.

A ball positioned at the row N and the column 2 may correspond to an address A11 , and a ball positioned at the row N and the column 8 may correspond to an address A13.

FIG. 3 is a diagram illustrating a portion of the memory module 100 shown in FIGS. 1A and 1B.

Referring to FIG. 3, balls of a first memory chip 120 of the first surface of the memory module 100 are disposed to face balls of a second memory chip 130 of the second surface of the memory module 100, with the printed circuit board 110 interposed therebetween. In the memory module 100 that is a mirrored memory module, the balls of the first memory chip 120 may be connected to the balls of the second memory chip 130 through TVHs or BVHs 112*a* and 112*b* of the printed circuit board 110. For example, an A6 address ball positioned at a row L and a column 2 (hereinafter, referred to as L2 ) of the first memory chip 120 may be connected to an A5 address ball positioned at a row L and a column 8 (hereinafter, referred to as L8 ) of the second memory chip 130 through the TVH or BVH 112a of the printed circuit board 110. An A5 address ball positioned at L8 of the first memory chip 120 may be connected to an A6 address ball positioned at L2 of the second memory chip 130 through the TVH or BVH 112b of the printed circuit board 110.

Similarly, a BG0 bank group address ball positioned at a row J and a column 2 (hereinafter, referred to as J2) of the first memory chip 120 may be connected to a BG1 bank group address ball positioned at a row J and a column 8 (hereinafter, referred to as J8) of the second memory chip 130 through a TVH or BVH of the printed circuit board 110. A BG1 bank group address ball positioned at J8 of the first memory chip 120 may be connected to a BG0 bank group address ball positioned at J2 of the second memory chip 130 through a TVH or BVH of the printed circuit board 110.

A BA0 bank address ball positioned at a row K and a column 2 (hereinafter, referred to as K2) of the first memory chip 120 may be connected to a BA1 bank address ball positioned at a row K and a column 8 (hereinafter, referred to as K8) of the second memory chip 130 through a TVH or BVH of the printed circuit board 110. A BA1 bank address ball positioned at K8 of the first memory chip 120 may be connected to a BA0 bank address ball positioned at K2 of the second memory chip 130 through a TVH or BVH of the printed circuit board 110.

An A4 address ball positioned at a row K and a column 3 (hereinafter, referred to as K3) of the first memory chip 120 may be connected to an A3 address ball positioned at a row K and a column 7 (hereinafter, referred to as K7) of the second memory chip 130 through a TVH or BVH of the printed circuit board 110. An A3 address ball positioned at K7 of the first memory chip 120 may be connected to an A4 address ball positioned at K3 of the second memory chip 130 through a TVH or BVH of the printed circuit board 110.

An A8 address ball positioned at a row M and a column 2 (hereinafter, referred to as M2) of the first memory chip 120 may be connected to an A7 address ball positioned at a row M and a column 8 (hereinafter, referred to as M8) of the second memory chip 130 through a TVH or BVH of the printed circuit board 110. An A7 address ball positioned at M8 of the first memory chip 120 may be connected to an A8 address ball positioned at M2 of the second memory chip 130 through a TVH or BVH of the printed circuit board 110.

An A11 address ball positioned at a row N and a column 2 (hereinafter, referred to as N2) of the first memory chip 120 may be connected to an A13 address ball positioned at a row N and a column 8 (hereinafter, referred to as N8) of the second memory chip 130 through a TVH or BVH of the printed circuit board 110. An A13 address ball positioned at N8 of the first memory chip 120 may be connected to an A11 address ball positioned at N2 of the second memory chip 130 through a TVH or BVH of the printed circuit board 110.

In the memory module 100, the BG0 and BG1 bank group address balls may be mirrored and connected to each other through a TVH or BVH of the printed circuit board 110, and the BA0 and BA1 bank address balls may be mirrored and connected to each other through a TVH or BVH of the printed circuit board 110. In addition, the A3 and A4 address balls may be mirrored and connected to each other through a TVH or BVH of the printed circuit board 110, the A5 and A6 address balls may be mirrored and connected to each other through a TVH or BVH of the printed circuit board 110, the A7 and A8 address balls may be mirrored and connected to each other through a TVH or BVH of the printed circuit board 110, and the A11 and A13 address balls may be mirrored and connected to each other through a TVH or BVH of the printed circuit board 110.

Figure 4:
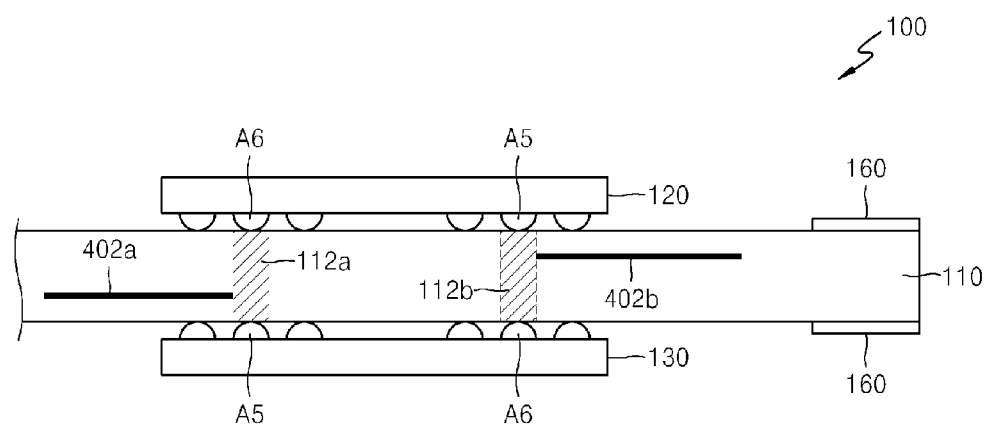
FIG. 4 is a diagram explanatory of a signal wiring of the memory module shown in FIGS. 1A and 1B.

FIG. 4 is a diagram explanatory of a signal wiring of the memory module 100 shown in FIGS. 1A and 1B. FIG. 4 shows a signal wiring in a cross-section taken along the line II-II in the memory module 100 of FIGS. 1A and 1B. The cross-section taken along the line II-II is a cross-section of the row L in the package ball assignment of FIGS. 2A and 2B.

Referring to FIG. 4, the A6 address ball positioned at L2 of the first memory chip 120 is connected to the A5 address ball positioned at L8 of the second memory chip 130 through the TVH or BVH 112a of the printed circuit board 110. The TVH or BVH 112a of the printed circuit board 110 is connected to a first signal wiring line 402a formed in an inner layer of the printed circuit board 110. The first signal wiring line 402a may be connected to the register 140 shown in FIG. 1A, and an address signal output from the register 140 may be transmitted through the first signal wiring line 402a. The address signal is applied to the A≠address ball of the first memory chip 120 or the A5 address ball of the second memory chip 130 through the first signal wiring line 402a.

The A5 address ball positioned at L8 of the first memory chip 120 is connected to the A6 address ball positioned at L2 of the second memory chip 130 through the TVH or BVH 112b of the printed circuit board 110. The TVH or BVH 112b of the printed circuit board 110 is connected to a second signal wiring line 402b formed in an inner layer of the printed circuit board 110. The second signal wiring line 402b may be connected to the register 140 of FIG. 1A, and an address signal output from the register 140 may be transmitted through the second signal wiring line 402b. The address signal is applied to the A5 address ball of the first memory chip 120 or the A6 address ball of the second memory chip 130 through the second signal wiring line 402b.

Whether the memory module 100 is good or faulty is tested through a test operation. Testing the memory module 100 means testing various functions, features, and modes of the first and second memory chips 120 and 130 mounted on the memory module 100. An operation of programming mode registers to be suitable for various functions, features, and modes of the first and second memory chips 120 and 130 is needed to test the first and second memory chips 120 and 130.

An MRS command for programming mode registers of the first memory chips 120 of the first rank and mode registers of the second memory chips 130 of the second rank is issued to test the memory module 100. The MRS command may be provided from a host or memory controller outside the memory module 100. The host or memory controller provides bit values together with the MRS command to an address bus so that the bit values and the MRS command are programmed in the mode registers of the first and second memory chips 120 and 130. The address bus is connected to the register 140 of the memory module 100 and transmits address signals to the register 140. The address signals are applied to the first and second memory chips 120 and 130 through the first and second signal wiring lines 402a and 402b of the printed circuit board 110, which are connected to the register 140.

As the capacity of the memory module 1000 increases, a time that is required for testing the memory module 100 may be increased. A rank-merged test may be performed to reduce a memory module test time. The rank-merged test is a method of testing ranks of the memory module 100 in parallel, that is, a test method of determining whether data output from the first memory chip 120 of the first rank coincides with data output from the second memory chip 130 of the second rank. In some embodiments, a rank parallel bit test (RankPBT) for comparing data output from the ranks of the memory module 100 by using an exclusive OR circuit may be performed as the method of testing ranks of the memory module 100 in parallel.

Figure 5:
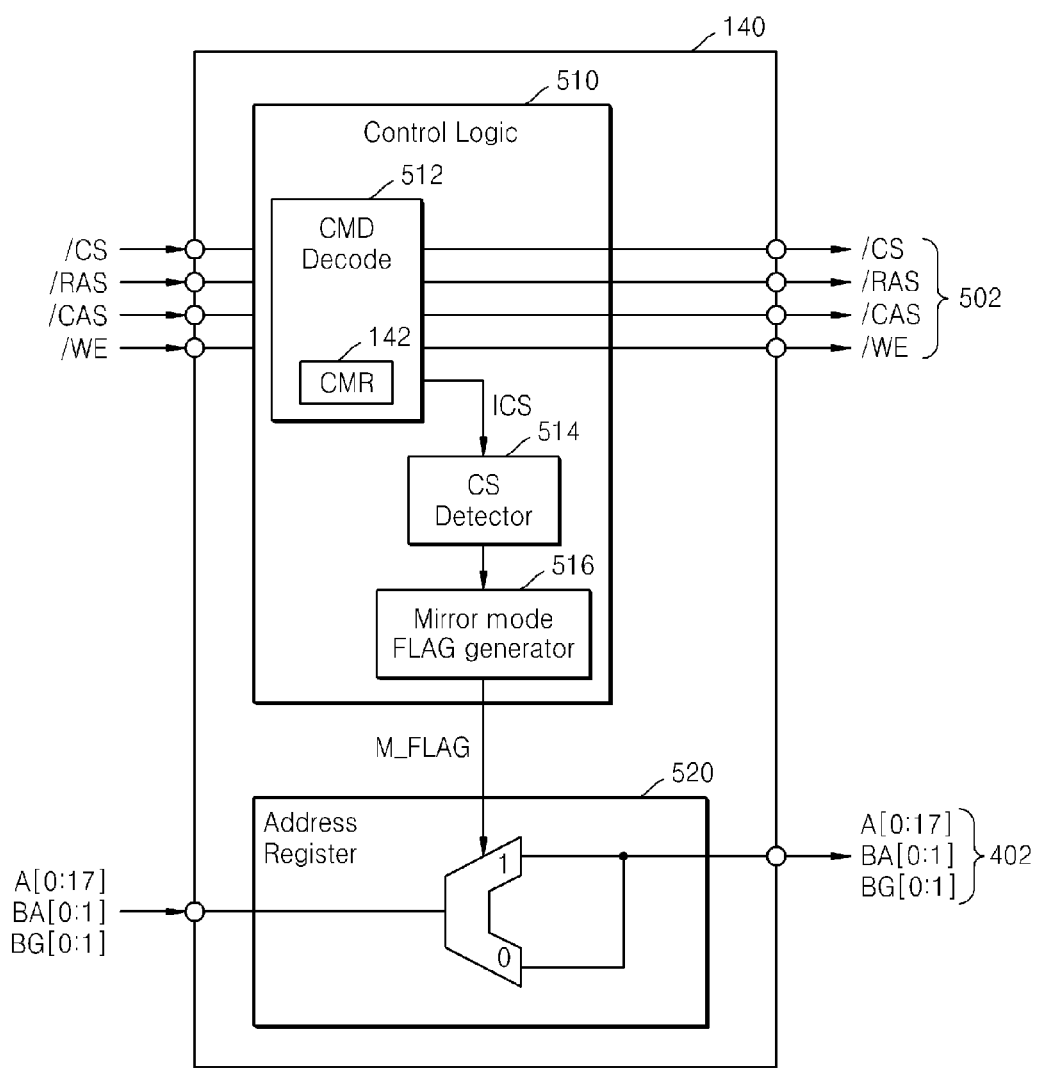
FIG. 5 is a block diagram illustrating a register shown in FIGS. 1A and 1B.

FIG. 5 is a block diagram illustrating the register 140 shown in FIG. 1A.

Referring to FIG. 5, the register 140 includes a control logic 510 that receives command signals provided from the host or memory controller, and an address register 520 that receives address signals provided from the host or memory controller. The control logic 510 may include a command decoder 512 that receives the command signals, such as a chip selection signal /CS, a row address strobe signal /RAS, a column address strobe signal /CAS, and a write enable signal /WE, and that outputs the received command signals to command signal lines 502. The command signal lines 502 may be connected to the first and second memory chips 120 and 130 through an inner layer of multiple layers formed in the printed circuit board 110 of the memory module 100 shown in FIGS. 1A and 1B.

The command decoder 512 may include a common mode register 142 providing an address mirroring function when testing the memory module 100 in a rank-merged test mode. In the rank-merged test mode, the common mode register 142 may be set so that mode registers of the first memory chips 120 of the first rank, and mode registers of the second memory chips 130 of the second rank, are programmed at once in response to an MRS command. In some embodiments, the common mode register 142 may not be included in the command decoder 512 but may be independently formed in the register 140 if necessary.

In the rank-merged test mode, the common mode register 142 receives an MRS command for the first memory chips 120 of the first rank. Responsive to the MRS command, the mode registers of the first memory chips 120 of the first rank are programmed depending on an address signal input together with the MRS command. Further responsive to the MRS command set in the common mode register 142, an address mirroring function is enabled so that the mode registers of the second memory chips 130 of the second rank are programmed identically with the mode registers of the first memory chips 120 of the first rank.

In the rank-merged test mode, the command decoder 512 generates an internal chip selection signal ICS according to the address mirroring function set in the common mode register 142. The command decoder 512 generates the internal chip selection signal ICS according to a first chip selection signal /CS0 included in the MRS command for the first memory chips 120 of the first rank. The internal chip selection signal ICS is set to be identical to the first chip selection signal /CS0. The command decoder 512 thereafter generates a second chip selection signal /CS1 to set the mode registers of the second memory chips 130, and generates the internal chip selection signal ICS that is the same as the second chip selection signal /CS1. The internal chip selection signal ICS that is the same as the second chip selection signal /CS1 functions as a signal for generating a mirror mode flag signal M_FLAG commanding the execution of an address mirroring operation.

The control logic 510 includes a chip selection (CS) detector 514 for detecting the internal chip selection signal ICS output from the command decoder 512, and a mirror mode flag generator 516 for generating the mirror mode flag signal M_FLAG in response to the detected internal chip selection signal ICS. The CS detector 514 may detect whether the internal chip selection signal ICS is the same as the first chip selection signal /CS0 or the second chip selection signal /CS1.

The mirror mode flag generator 516 deactivates the mirror mode flag signal M_FLAG (to be 0 for example) when the internal chip selection signal ICS is the same as the first chip selection signal /CS0, and activates the mirror mode flag signal M_FLAG (to be 1 for example) when the internal chip selection signal ICS is the same as the second chip selection signal /CS1. The mirror mode flag signal M_FLAG is provided to the address register 520 so that address signals input to the address register 520 are selectively mirrored.

The address register 520 receives bank group address signals BG[0:1], bank address signals BA[0:1], and address signals A[0:17]. The address register 520 selects address signals set to be address-mirrored from among address signals received in response to the activated mirror mode flag signal M_FLAG, converts the selected address signals into mirroring address signals, and transmits the mirroring address signals to address signal lines 402.

The address signals set to be address-mirrored are address signals other than address signals that are set by a command from among the received address signals. The address signals that are set by a command include, for example, address signals A0-A2 for setting a burst length, an address signal A10 for setting an auto-precharge, an address signal A12 for setting a burst chop (BC), and the like.

The address signals set to be address-mirrored include, for example, the bank group address signals BG0 and BG1, the bank address signals BA0 and BA1, the address signals A3 and A4 the address signals A5 and A6 the address signals A7 and A8 and the address signals A11 and A13.

The address register 520 converts the bank group address signal BG0 into the bank group address signal BG1 in response to an activated mirror mode flag signal M_FLAG. This means that when the mode registers of the first memory chips 120 are programmed according to the bank group address signal BG0 which is input together with the MRS command to the first memory chips 120 of the first rank, the bank group address signal BG0 of the first memory chips 120 is converted into the bank group address signal BG1 of the first memory chips 120, which is a mirroring address signal of the bank group address signal BG0 of the second memory chips 130, so that the mode registers of the second memory chips 130 of the second rank are also programmed identically with the bank group address signal BG0 of the first memory chips 120.

Similarly, the address register 520 converts the bank group address signal BG1 into the bank group address signal BG0 in response to the activated mirror mode flag signal M_FLAG. In response to the activated mirror mode flag signal M_FLAG, the address register 520 converts the bank address signal BA0 into the bank address signal BA1, and converts the bank address signal BA1 into the bank address signal BA0. In response to the activated mirror mode flag signal M_FLAG, the address register 520 converts the address signal A3 into the address signal A4 and converts the address signal A4 into the address signal A3 In response to the activated mirror mode flag signal M_FLAG, the address register 520 converts the address signal A5 into the address signal A6 and converts the address signal A6 into the address signal A5 In response to the activated mirror mode flag signal M_FLAG, the address register 520 converts the address signal A7 into the address signal A8 and converts the address signal A8 into the address signal A8 In addition, in response to the activated mirror mode flag signal M_FLAG, the address register 520 converts the address signal A11 into the address signal A13 and converts the address signal A13 into the address signal A11. The bank group address signals BG0 and BG1, the bank address signals BA0 and BA1, the address signals A3 and A4 the address signals A5 and A6 the address signals A7 and A8 and the address signals A11 and A—are transmitted to the address signal lines 402.

When the mirror mode flag signal M_FLAG is active, the address register 520 transmits address signals that are set so as not to be address-mirrored, for example the address signals A1-A2, A9-A10, A12, and A14-A17, to the address signal lines 402 without converting. Moreover, when the mirror mode flag signal M_FLAG is inactive, the address register 520 transmits received bank group address signals BG[0:1], bank address signals BA[0:1], and address signals A[0:17 to the address signal lines 402 without converting.

Figure 6:
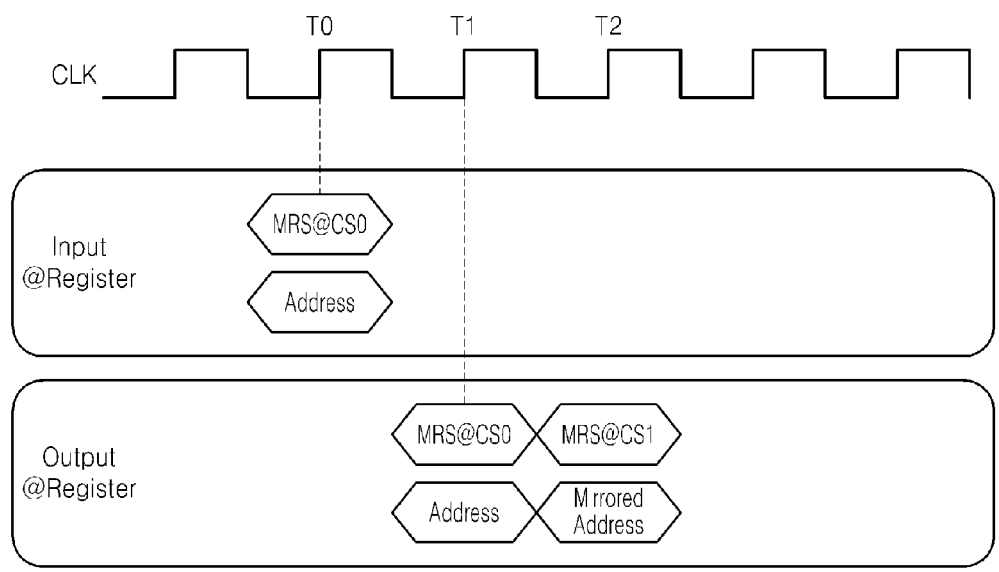
FIG. 6 is a diagram illustrating an operation timing of the register shown in FIG. 5.

FIG. 6 is a diagram illustrating an operation timing of the register 140 shown in FIG. 5.

Referring to FIG. 6 together with FIG. 5, the mode registers of the first memory chips 120 of the first rank and the mode registers of the second memory chips 130 of the second rank are programmed according to a first MRS command MRS@CS0 and address signals for the first memory chips 120 of the first rank, which are input to the register 140 during a rank-merged test of the memory module 100 of FIG. 1.

At time T0, the first MRS command MRS@CS0 and address signals for the first memory chips 120 of the first rank are input to the register 140. The first MRS command MRS@CS0 includes a first chip selection signal /CS0 for selecting the first memory chips 120 of the first rank.

At time T1, the first MRS command MRS@CS0 is provided to the first memory chips 120 through the command signal lines 502 and the address signals are provided to the first memory chips 120 through the address signal lines 402. The mode registers of the first memory chips 120 are programmed according to the address signals.

At time T2, the register 140 generates a second MRS command MRS @CS1 and selectively mirrored address signals. The second MRS command MRS @CS1 is a command for setting the mode registers of the second memory chips 130 of the second rank and includes a second chip selection signal /CS1 for selecting the second memory chips 130 of the second rank. The mirrored address signals include, for example, the bank group addresses BG0 and BG1, the bank addresses BA0 and BA1, the addresses A3 and A4 the addresses A5 and A6 the addresses A7 and A8 and the addresses A11 and A13. By the register 140, the second MRS command MRS@CS1 is provided to the second memory chips 130 through the command signal lines 502, and the mirrored address signals and the non-mirrored address signals (for example the address signals A0-A2 A9-A10, A12 and A14-A17 ) are provided to the second memory chips 130 through the address signal lines 402. The mode registers of the second memory chips 130 are thus programmed according to received address signals and are programmed identically with the mode registers of the first memory chips 120.

As shown in FIG. 6, in a rank-merged test mode of the memory module 100, the mode registers of the first memory chips 120 of the first rank may be programmed identically with the mode registers of the second memory chips 130 of the second rank at once in response to the above noted first MRS command MRS@CS0 and address signals input to register 140 at time T0. Accordingly, a test time may be reduced in half, compared to a method in which a memory module is tested after separately programming memory chips of a first rank of a memory module and memory chips of a second rank of the memory module. Thus, the productivity of the memory module 100 may be improved by reducing the test time.

FIGS. 7A and 7B are diagrams respectively illustrating first and second surfaces of a memory module 700 having an address mirroring function, according to another embodiment of the inventive concept.

Referring to FIGS. 7A and 7B, the memory module 700 is a 4-rank R-DIMM. Two rows of memory chips 720 and 722 and a register 740 are mounted on a first surface of the memory module 700 in a direction of the length of a printed circuit board 710, as shown in FIG. 7A. Also, two rows of memory chips 730 and 732 are mounted on a second surface of the memory module 700, as shown in FIG. 7B. On the first surface of the memory module 700, the memory chips 720 of a first row which is disposed adjacent to a tab 760 of an edge portion of the printed circuit board 710 constitute a first rank, and the memory chips 722 of a second row constitute a third rank. On the second surface of the memory module 700, the memory chips 730 of a first row which is disposed adjacent to the tab 760 of the edge portion of the printed circuit board 710 constitute a second rank, and the memory chips 732 of a second row constitute a fourth rank.

The memory chips 720 of the first rank (hereinafter, referred to as first memory chips 720) are activated by a first chip selection signal /CS0, and the memory chips 730 of the second rank (hereinafter, referred to as second memory chips 730) are activated by a second chip selection signal /CS1. The memory chips 722 of the third rank (hereinafter, referred to as third memory chips 722) are activated by a third chip selection signal /CS2, and the memory chips 732 of the fourth rank (hereinafter, referred to as fourth memory chips 732) are activated by a fourth chip selection signal /CS3.

The memory module 700 is a mirrored module in which balls of the first memory chips 720 are symmetrically connected to balls of the second memory chips 730 through TVHs or BVHs of the printed circuit board 710, and balls of the third memory chips 722 are symmetrically connected to balls of the fourth memory chips 732 through TVHs or BVHs of the printed circuit board 710.

When the first through fourth memory chips 720, 730, 722, and 732 each have the package ball assignment illustrated in FIGS. 2A and 2B, balls of the first through fourth memory chips 720, 730, 722, and 732 are connected to each other as follows: With respect to the balls of the first memory chips 720 and the balls of the second memory chips 730, BG0 and BG1 bank group address balls may be mirrored and connected to each other through a TVH or BVH of the printed circuit board 710, and BA0 and BA1 bank address balls may be mirrored and connected to each other through a TVH or BVH of the printed circuit board 710. In addition, A3 and A4 address balls may be mirrored and connected to each other through a TVH or BVH of the printed circuit board 710, A5 and A6 address balls may be mirrored and connected to each other through a TVH or BVH of the printed circuit board 710, A7 and A8 address balls may be mirrored and connected to each other through a TVH or BVH of the printed circuit board 710, and A11 and A13 address balls may be mirrored and connected to each other through a TVH or BVH of the printed circuit board 710.

With respect to the balls of the third memory chips 722 and the balls of the fourth memory chips 732, BG0 and BG1 bank group address balls may be mirrored and connected to each other through a TVH or BVH of the printed circuit board 710, and BA0 and BA1 bank address balls may be mirrored and connected to each other through a TVH or BVH of the printed circuit board 710. In addition, A3 and A4 address balls may be mirrored and connected to each other through a TVH or BVH of the printed circuit board 710, A5 and A6 address balls may be mirrored and connected to each other through a TVH or BVH of the printed circuit board 710, A7 and A8 address balls may be mirrored and connected to each other through a TVH or BVH of the printed circuit board 710, and A11 and A13 address balls may be mirrored and connected to each other through a TVH or BVH of the printed circuit board 710.

The register 740 receives command signals, address signals, and a clock signal, which are provided from a host or memory controller, and transmits the received signals to the first through fourth memory chips 720, 722, 730, and 732. The register 740 may include a common mode register 742 for setting an operation mode of the memory module 700. The common mode register 742 may set a test mode when testing the memory module 700 and may set a rank-merged test mode to reduce a memory module test time.

The common mode register 742 may selectively provide an address mirroring function for each even rank and each odd rank during a rank-merged test. The first and third ranks (i.e., Rank0 and Rank2) of the memory module 700 are referred to as even ranks, and the second and fourth ranks (i.e., Rank1 and Rank3) of the memory module 700 are referred to as odd ranks. The address mirroring function may be applied to the odd ranks Rank1 and Rank3 as illustrated in Table 1. The odd ranks Rank1 and Rank3 may select address signals set to be address-mirrored from among received address signals and convert the selected address signals into mirroring address signals.

TABLE 1

| Rank | Address mirroring function |
| --- | --- |
| First rank (Rank0) | X |
| Second rank (Rank1) | O |
| Third rank (Rank2) | X |
| Fourth rank (Rank3) | O |

During the rank-merged test, the register 740 may allow mode registers of the first memory chips 720 of the first rank and mode registers of the second memory chips 730 of the second rank to be identically programmed in response to a first MRS command, and may allow mode registers of the third memory chips 722 of the third rank and mode registers of the fourth memory chips 732 of the fourth rank to be identically programmed in response to a third MRS command. The first MRS command is a command for setting the mode registers of the first memory chips 720 of the first rank, and the third MRS command is a command for setting the mode registers of the third memory chips 722 of the third rank.

The register 740 receives the first MRS command from the host or memory controller and programs the mode registers of the first memory chips 720 of the first rank according to first address signals, which are received together with the first MRS command, in response to the first chip selection signal /CS0 included in the first MRS command. Next, the register 740 generates a second MRS command including the second chip selection signal /CS1 for selecting the second memory chips 730 of the second rank, selects address signals set to be address-mirrored from among the first address signals received together with the first MRS command, and converts the selected address signals into mirroring address signals. The second MRS command is a command for setting the mode registers of the second memory chips 730 of the second rank. The register 740 programs the mode registers of the second memory chips 730 of the second rank according to the first address signals, which are received together with the second MRS command and includes selectively mirrored address signals, in response to the second chip selection signal /CS1 included in the second MRS command. Accordingly, the mode registers of the second memory chips 730 of the second rank are programmed identically with the mode registers of the first memory chips 720 of the first rank.

The register 740 receives the third MRS command from the host or memory controller and programs the mode registers of the third memory chips 722 of the third rank according to third address signals, which are received together with the third MRS command, in response to the third chip selection signal /CS2 included in the third MRS command. Next, the register 740 generates a fourth MRS command including the fourth chip selection signal /CS3 for selecting the fourth memory chips 732 of the fourth rank, selects address signals set to be address-mirrored from among the third address signals received together with the third MRS command, and converts the selected address signals into mirroring address signals. The register 740 programs the mode registers of the fourth memory chips 732 of the fourth rank according to the third address signals, which are received together with the fourth MRS command and includes selectively mirrored address signals, in response to the fourth chip selection signal /CS3 included in the fourth MRS command. Accordingly, the mode registers of the fourth memory chips 732 of the fourth rank are programmed identically with the mode registers of the third memory chips 722 of the third rank.

Figure 8:
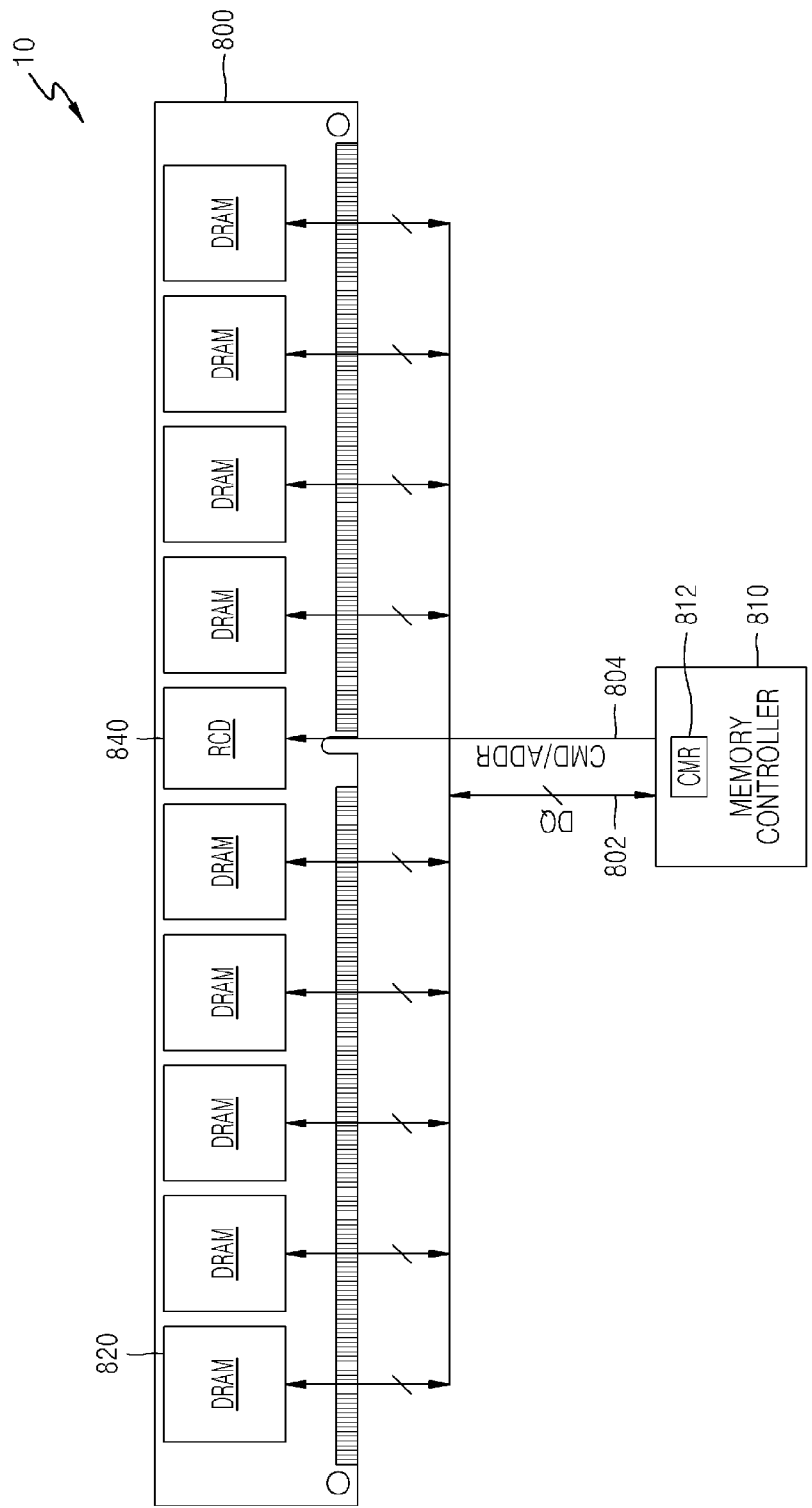
FIG. 8 is a diagram illustrating a memory system including a memory module having an address mirroring function, according to an embodiment of the inventive concept.

FIG. 8 is a diagram illustrating a memory system 10 including a memory module having an address mirroring function, according to an embodiment of the inventive concept.

Referring to FIG. 8, the memory system 10 includes a memory module 800 and a memory controller 810. The memory module 800 may include a first rank and a second rank, similar to the memory module 100 of FIG. 1, which is an R-DIMM module. However, a register 840 of the memory module 800 does not provide an address mirroring function, unlike the memory module 100 of FIG. 1, which is an R-DIMM module.

The memory controller 810 may be connected to memory chips 820 through a data bus 802 for transmitting or receiving data DQ to or from the memory chips 820 of the memory module 800, and a control bus 804 for transmitting commands, addresses, and a clock signal which are used to command a data write or data read operation. The memory controller 810 may be directly connected to a central processing unit (CPU). In some other embodiments, the memory controller 810 may be manufactured as a part of a CPU.

The memory controller 810 may include a common mode register 812 providing an address mirroring function so as to identically program mode registers of memory chips 820 of the first rank and mode registers of memory chips 820 of the second rank during a rank-merged test mode of the memory module 800.

The memory controller 810 transmits address signals for mode register setting in addition to a first MRS command including a first chip selection signal /CS0 for selecting the first rank of the memory module 800 to the register 840 of the memory module 800 through the control bus 804. The register 840 programs the mode registers of the memory chips 820 of the first rank according to the address signals received together with the first MRS command.

Next, the memory controller 810 generates a second MRS command including a second chip selection signal /CS1 for selecting the memory chips 820 of the second rank, selects address signals set to be address-mirrored from among the address signals transmitted together with the first MRS command, and converts the selected address signals into mirroring address signals. The memory controller 810 transmits address signals, including selectively mirrored address signals, to the register 840 of the memory module 800 through the control bus 804. The register 840 programs the mode registers of the memory chips 820 of the second rank according to the address signals received together with the second MRS command. Accordingly, the mode registers of the memory chips 820 of the second rank may be programmed identically with the mode registers of the memory chips 820 of the first rank.

Figure 9:
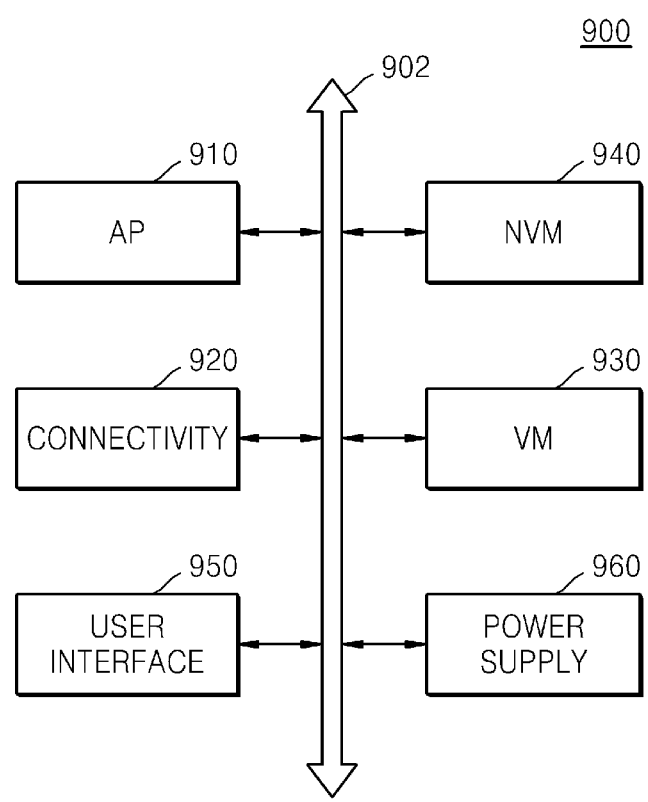
FIG. 9 is a block diagram illustrating a mobile system to which a memory module having an address mirroring function is applied, according to an embodiment of the inventive concept.

FIG. 9 is a block diagram illustrating a mobile system 900 to which a memory module having an address mirroring function is applied, according to an embodiment of the inventive concept.

Referring to FIG. 9, the mobile system 900 may include an application processor 910, a connectivity unit 920, a first memory device 930, a second memory device 940, a user interface 950, and a power supply 960, which are connected to one another through a bus 902. The first memory device 930 may be a volatile memory device, and the second memory device 940 may be a nonvolatile memory device. In some embodiments, the mobile system 900 may be an arbitrary mobile system, such as a mobile phone, a smart phone, a personal digital assistant (PDA), a portable multimedia player (PMP), a digital camera, a music player, a portable game console, or a navigation system.

The application processor 910 may execute applications providing an Internet browser, games, and moving pictures. In some embodiments, the application processor 910 may include a processor core (single core) or a plurality of processor cores (multi-core). For example, the application processor 910 may include a dual-core, a quad-core, or a hexa-core. Also, the application processor 910 may further include a cache memory located in or outside the application processor 910.

The connectivity unit 920 may communicate with an external device wirelessly or through wires. For example, the connectivity unit 920 may perform Ethernet communication, near field communication (NFC), radio frequency identification (RFID) communication, mobile telecommunication, memory card communication, or universal serial bus (USB) communication. For example, the connectivity unit 920 may include a base band chipset and may support communication such as global system for mobile communications (GSM), general packet radio service (GPRS), wideband code division multiple access (WCDMA), and high speed packet access (HSxPA).

The first memory device 930, which may be a volatile memory device, may store data processed by the application processor 910, or may operate as a working memory. The first memory device 930 may be a memory module having an address mirroring function. The first memory device 930 may be a memory module including: first memory chips of a first rank, which are mounted on a first surface of a printed circuit board, second memory chips of a second rank, which are mounted on a second surface which is opposite to the first surface of the printed circuit board, and a register that allows mode registers of the first memory chips of the first rank and mode registers of the second memory chips of the second rank to be identically programmed according to address signals, which are received together with a first MRS command, in response to the first MRS command during a rank-merged test of the memory module. The memory module may be a mirrored module in which balls of the first memory chips are connected to balls of the second memory chips through TVHs or BVHs of the printed circuit board. In the first memory device 930, first and second balls of a first memory chip, to which first and second address signals are respectively applied, are respectively mirrored and connected to second and first balls of a second memory chip, to which the second and first address signals are respectively applied, through the TVHs or BVHs of the printed circuit board. The first and second address signals may be set so as to be selectively mirrored by the register. The first and second address signals may be address signals other than address signals set by a command from among the received address signals.

The second memory device 940 that is a nonvolatile memory device may store a boot image for booting the mobile system 900. For example, the second memory device 940 may be electrically erasable programmable read-only memory (EEPROM), a flash memory, phase change random access memory (PRAM), resistance random access memory (RRAM), a nano floating gate memory (NFGM), polymer random access memory (PoRAM), magnetic random access memory (MRAM), ferroelectric random access memory (FRAM), or the like.

The user interface 950 may include one or more input devices such as a keypad and a touch screen, and/or a speaker, a display device, and one or more output devices. The power supply 960 may supply an operating voltage. Also, in some embodiments, the mobile system 900 may include a camera image processor (CIP), and may further include a storage device such as a memory card, a solid state drive (SSD), a hard disk drive (HDD), and a CD-ROM.

Figure 10:
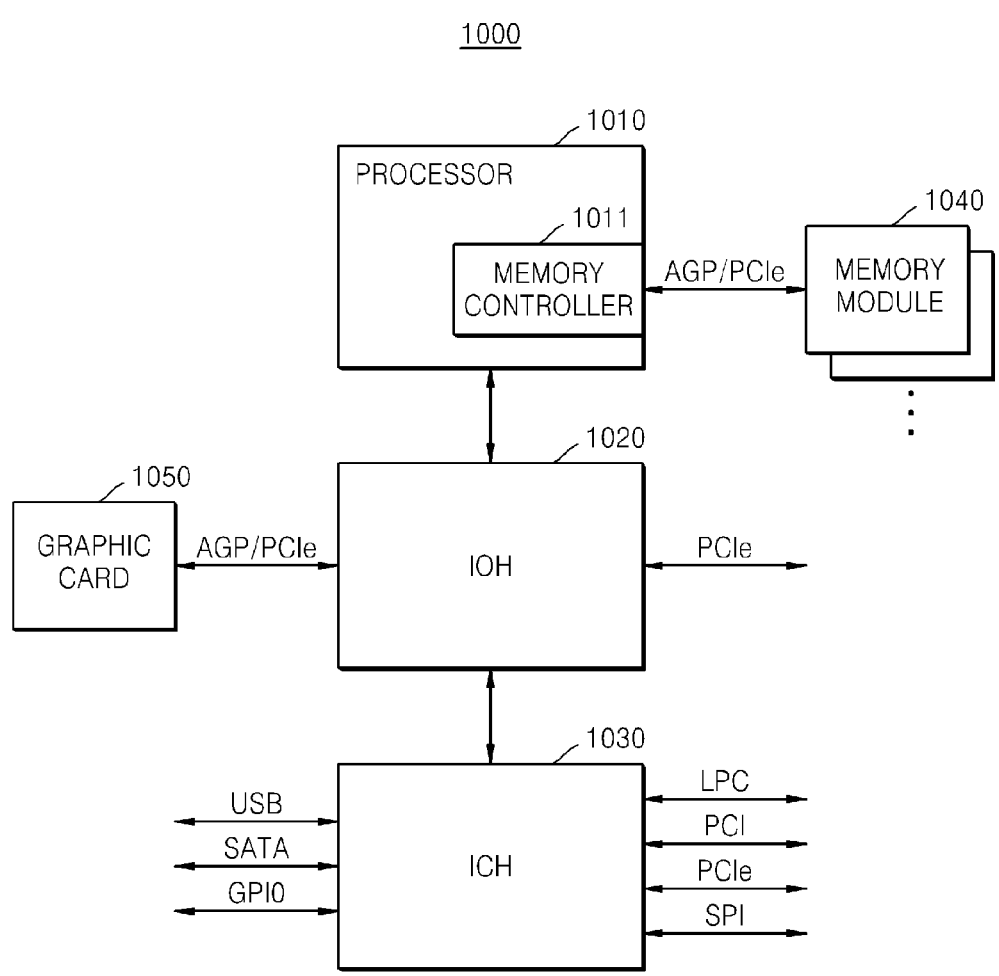
FIG. 10 is a block diagram illustrating a computer system to which a memory module having an address mirroring function is applied, according to an embodiment of the inventive concept.

FIG. 10 is a block diagram illustrating a computer system 1000 to which a memory module having an address mirroring function is applied, according to an embodiment of the inventive concept.

Referring to FIG. 10, the computer system 1000 includes a processor 1010, an input/output hub 1020, an input/output controller hub 1030, at least one memory module 1040, and a graphics card 1050. In some embodiments, the computer system 1000 may be a computing system, such as a personal computer (PC), a server computer, a workstation, a laptop computer, a mobile phone, a smartphone, a PDA, a PMP, a digital camera, a digital TV, a set-top box, a music player, a portable game console, or a navigation system.

The processor 1010 may execute various computing functions such as certain calculations or tasks. For example, the processor 1010 may be a micro-processor or a CPU. In some embodiments, the processor 1010 may include one processor core (single core) or a plurality of processor cores (multi-core). For example, the processor 1010 may include a dual-core, a quad-core, or a hexa-core. Also, although the computer system 1000 shown in FIG. 10 includes one processor 1010, the computer system 1000 may include a plurality of processors, according to another embodiment of the inventive concept. Also, the processor 1010 may further include a cache memory located inside or outside thereof.

The processor 1010 may include a memory controller 1011 controlling operations of the memory module 1040. The memory controller 1011 included in the processor 1010 may be referred to as an integrated memory controller (IMC). A memory interface between the memory controller 1011 and the memory module 1040 may include one channel including a plurality of signal lines, or a plurality of channels. In addition, one or more memory modules 1040 may be connected to each of the channels. In some embodiments, the memory controller 1011 may be located in the input/output hub 1020. The input/output hub 1020 including the memory controller 1011 may be referred to as a memory controller hub (MCH).

The memory module 1040 may be a memory module having an address mirroring function. The memory module 1040 may include first memory chips of a first rank, which are mounted on a first surface of a printed circuit board, second memory chips of a second rank, which are mounted on a second surface which is opposite to the first surface of the printed circuit board, and a register that allows mode registers of the first memory chips of the first rank and mode registers of the second memory chips of the second rank to be identically programmed according to address signals, which are received together with a first MRS command, in response to the first MRS command during a rank-merged test of the memory module. The memory module 1040 may be a mirrored module in which balls of the first memory chips are connected to balls of the second memory chips through TVHs or BVHs of the printed circuit board. In the memory module 1040, first and second balls of a first memory chip, to which first and second address signals are respectively applied, are respectively mirrored and connected to second and first balls of a second memory chip, to which the second and first address signals are respectively applied, through the TVHs or BVHs of the printed circuit board. The first and second address signals may be set so as to be selectively mirrored by the register. The first and second address signals may be address signals other than address signals set by a command from among the received address signals.

The input/output hub 1020 may manage data transmission between the devices such as the graphics card 1050 and the processor 1010. The input/output hub 1020 may be connected to the processor 1010 via various kinds of interfaces. For example, the input/output hub 1020 and the processor 1010 may be connected to each other via various interfaces such as a front side bus (FSB), a system bus, hypertransport, lighting data transport (LDT), quickpath interconnect (QPI), a common system interface, or peripheral component interface-express (PCIe). In FIG. 10, the computer system 1000 includes one input/output hub 1020; however, the computer system 1000 may include a plurality of input/output hubs.

The input/output hub 1020 may provide various interfaces to devices. For example, the input/output hub 1020 may provide an accelerated graphics port (AGP) interface, a PCIe interface, and a communications streaming architecture (CSA) interface.

The graphics card 1050 may be connected to the input/output hub 1020 via the AGP or the PCIe. The graphics card 1050 may control a display device (not shown) for displaying images. The graphics card 1050 may include an internal processor for processing image data, and an internal semiconductor memory. In some embodiments, the input/output hub 1020 may include a graphics device therein with the graphics card 1050 located on the outside of the input/output hub 1020, or instead of the graphics card 1050. The graphics device included in the input/output hub 1020 may be referred to as integrated graphics. Also, the input/output hub 1020, including the memory controller and the graphics device, may be referred to as a graphics and memory controller hub (GMCH).

The input/output controller hub 1030 may perform data buffering and interface relay so that various system interfaces operate effectively. The input/output controller hub 1030 may be connected to the input/output hub 1020 via an internal bus. For example, the input/output hub 1020 and the input/output controller hub 1030 may be connected to each other via a direct media interface (DMI), a hub interface, an enterprise southbridge interface (ESI), or a PCIe interface.

The input/output controller hub 1030 may provide various interfaces to peripheral devices. For example, the input/output controller hub 1030 may provide a universal serial bus (USB) port, a serial advanced technology attachment (SATA) port, a general purpose input/output (GPIO) port, a low pin count (LPC) bus, a serial peripheral interface (SPI), PCI, or PCIe.

In some embodiments, two or more of the processor 1010, the input/output hub 1020, and the input/output controller hub 1030 may be implemented as one chipset.

While the inventive concept has been particularly shown and described with reference to example embodiments thereof, it will be understood that various changes in form and details may be made therein without departing from the spirit and scope of the following claims.

What is claimed is:

1. A memory module comprising:
   first memory chips of a first rank, mounted on a first surface of a printed circuit board;
   second memory chips of a second rank, mounted on a second surface of the printed circuit board that is opposite to the first surface of the printed circuit board; and
   a register configured to identically program mode registers of the first memory chips of the first rank and mode registers of the second memory chips of the second rank according to address signals received together with a first mode register set (MRS) command, in response to the first MRS command during testing of the memory module, wherein:
   the mode registers of the first memory chips are programmed according to the address signals,
   the mode registers of the second memory chips are programmed according to a first portion of the address signals and mirrored address signals that are converted from a second portion of the address signals, and
   the second portion of the address signals exclude the address signals within the first portion of the address signals.

2. The memory module of claim 1, wherein the memory module is a mirrored module wherein balls of the first memory chips are connected to balls of the second memory chips through through-via-holes (TVHs) or blind-via-holes (BVHs) of the printed circuit board.

3. The memory module of claim 2, wherein first and second balls of a first memory chip to which first and second address signals are respectively applied, are respectively mirrored and connected to second and first balls of a second memory chip to which the second and first address signals are respectively applied, through the TVHs or BVHs of the printed circuit board, and the first and second address signals are set so as to be selectively mirrored by the register.

4. The memory module of claim 3, wherein the first and second address signals are address signals other than address signals set by a command from among the received address signals.

5. The memory module of claim 1, wherein the register is configured to generate a second MRS command for the second memory chips of the second rank, select the second portion of address signals set to be address-mirrored from among the address signals, convert the selected second portion of address signals into mirrored address signals in response to the second MRS command, and program the mode registers of the second memory chips of the second rank according to the address signals including the mirrored address signals.

6. The memory module of claim 1, wherein the register comprises:
a command decoder configured to generate an internal chip selection signal in response to the first MRS command;
a control logic configured to detect the internal chip selection signal and generate a mirror mode flag signal in response to the detected internal chip selection signal; and
an address register configured to receive the address signals, select the second portion of address signals set to be address-mirrored from among the received address signals, and convert the selected second portion of address signals into mirroring address signals in response to the mirror mode flag signal.

7. The memory module of claim 6, wherein the command decoder is configured to generate the internal chip selection signal according to a first chip selection signal included in the first MRS command for the first memory chips of the first rank, generate a second MRS command to set the mode registers of the second memory chips of the second rank, and generate the internal chip selection signal according to a second chip selection signal included in the second MRS command.

8. The memory module of claim 7, wherein the control logic comprises:
a detector configured to detect the internal chip selection signal; and
a mirror mode flag generator configured to deactivate the mirror mode flag signal when the internal chip selection signal is the same as the first chip selection signal and activate the mirror mode flag signal when the internal chip selection signal is the same as the second chip selection signal.

9. The memory module of claim 1, further comprising:
third memory chips of a third rank, mounted on the first surface of the printed circuit board; and
fourth memory chips of a fourth rank, mounted on the second surface of the printed circuit board,
wherein the register is configured to identically program mode registers of the third memory chips of the third rank and mode registers of the fourth memory chips of the fourth rank according to first address signals received together with a second MRS command.

10. The memory module of claim 9, wherein the register is configured to receive the second MRS command for the third memory chips of the third rank and the first address signals, and program the mode registers of the third memory chips of the third rank according to the first address signals.

11. The memory module of claim 9, wherein the register is configured to generate a third MRS command for the fourth memory chips of the fourth rank, select address signals set to be address-mirrored from among the first address signals which are received together with the second MRS command, convert the selected address signals into mirrored address signals in response to the third MRS command, and program the mode registers of the fourth memory chips of the fourth rank according to the address signals including the mirrored address signals.

12. A method of testing a memory module in which balls of first memory chips of a first rank on a first surface of a printed circuit board are connected to balls of second memory chips of a second rank on a second surface of the printed circuit board which is opposite to the first surface, through through-via-holes (TVHs) or blind-via-holes (BVHs) of the printed circuit board, the method comprising:
receiving a first mode register set (MRS) command for the first memory chips of the first rank and address signals;
programming mode registers of the first memory chips according to the address signals; and
generating a second MRS command for the second memory chips of the second rank, selecting a first portion of the address signals to be address-mirrored from among the address signals, converting the selected first portion of address signals into mirrored address signals in response to the second MRS command, and programming mode registers of the second memory chips of the second rank according to a second portion of the address signals and the mirrored address signals, wherein
the first portion of the address signals exclude the address signals within the second portion of the address signals.

13. The method of claim 12, wherein the first portion of address signals set to be address-mirrored are selected and converted into the mirrored address signals by a register mounted on the memory module.

14. The method of claim 12, wherein the first portion of address signals set to be address-mirrored are selected and converted into the mirrored address signals by a memory controller outside the memory module.

15. A register for testing a memory module, the register comprising:
a control logic configured to receive a first mode register set (MRS) command and address signals for testing first memory chips of a first rank on a first surface of a printed circuit board of the memory module, and generate a first mirror mode flag signal responsive to the first MRS command; and
an address register configured to provide the address signals for programming mode registers of the first memory chips, and provide mirrored address signals for programming mode registers of second memory chips of a second rank on a second surface of the printed circuit board opposite the first surface, responsive to the first mirror mode flag signal, wherein:
the mode registers of the first memory chips are programmed according to the address signals,
the mode registers of the second memory chips are programmed according to a first portion of the address signals and the mirrored address signals that are converted from a second portion of the address signals, and
the second portion of the address signals exclude the address signals within the first portion of the address signals.

16. The register of claim 15, wherein the address register is further configured to select the second portion of address signals from among the address signals, and convert the selected second portion of address signals into the mirrored address signals.

17. The register of claim 15, wherein the control logic comprises:
a command decoder configured to generate an internal chip selection signal according to a first chip selection signal included in the first MRS command, generate a second MRS command to set the mode registers of the second memory chips of the second rank, and generate the internal chip selection signal according to a second chip selection signal included in the second MRS command;

a detector configured to detect the internal chip selection signal; and a mirror mode flag generator configured to generate the first mirror mode flag signal responsive to the internal chip selection signal.

18. The register of claim 15, wherein the control logic is further configured to receive a second mode register set (MRS) command and first address signals for testing third memory chips of a third rank on the first surface of the printed circuit board of the memory module, and generate a second mirror mode flag signal responsive to the second MRS command, and the address register is further configured to provide the first address signals for programming mode registers of the third memory chips, and provide mirrored first address signals for programming mode registers of fourth memory chips of a fourth rank on the second surface of the printed circuit board, responsive to the second mirror mode flag signal.

19. The register of claim 18, wherein the address register is further configured to detect selected address signals from among the first address signals, and convert the selected first address signals into the mirrored first address signals.

* * * * *